(12) United States Patent
Li et al.

(10) Patent No.: US 8,296,102 B2
(45) Date of Patent: Oct. 23, 2012

(54) SYSTEM AND METHOD FOR TESTING DERATING PERFORMANCE OF A COMPONENT OF AN ELECTRONIC DEVICE

(75) Inventors: Shen-Chun Li, Taipei Hsien (TW); Shou-Kuo Hsu, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 358 days.

(21) Appl. No.: 12/770,738

(22) Filed: Apr. 30, 2010

(65) Prior Publication Data

US 2011/0015897 A1    Jan. 20, 2011

(30) Foreign Application Priority Data

Jul. 17, 2009 (CN) .......................... 2009 1 0304460

(51) Int. Cl.
G01R 15/00 (2006.01)
G01R 19/00 (2006.01)
G01R 31/00 (2006.01)
G06F 11/30 (2006.01)
G21C 17/00 (2006.01)

(52) U.S. Cl. ............ 702/182; 702/57; 702/64; 702/117; 702/179; 702/183

(58) Field of Classification Search ................... 702/57, 702/64, 117, 179, 182, 183
See application file for complete search history.

(56) References Cited

U.S. PATENT DOCUMENTS 6,720,194 B1 *   4/2004   Miller et al. ................... 438/14
2011/0082682 A1 *   4/2011   Timmerhoff ................... 703/17

* cited by examiner

*Primary Examiner* — Janet Suglo
(74) *Attorney, Agent, or Firm* — Altis Law Group, Inc.

(57) ABSTRACT

A system and method for testing derating performance of a component obtains a component list, a pin list, and a standard derating list of the electronic device from a storage. The system and method further receives parameters of each component, the parameters of each component comprising voltages of two pins of the component and a working temperature of the component, calculates a working voltage and a derating ratio of the component according to the parameters. The system and method also analyzes the working voltage and the derating ratio of the component to get analysis result, generates a test report comprising the derating ratio, the working temperature, the analysis results of each component in the component list, and storing the test report in the storage.

15 Claims, 3 Drawing Sheets

SYSTEM AND METHOD FOR TESTING DERATING PERFORMANCE OF A COMPONENT OF AN ELECTRONIC DEVICE

BACKGROUND

1. Technical Field

Embodiments of the present disclosure relate to test technology, and particularly to a system and method for testing derating performance of a component of an electronic device.

2. Description of Related Art

Component derating is a method used to lower the rated electrical capability of a component (e.g., resistors, integrated circuits) of an electronic device. A derating test of a component of the electronic device is an important phase in the manufacturing process to establish that manufactured parts will perform to desired standards. For further improvements in quality of components, a prompt and accurate derating test of the components is desirable.

DETAILED DESCRIPTION

All of the processes described below may be embodied in, and fully automated via, functional code modules executed by one or more general purpose computers or processors. The code modules may be stored in any type of readable medium or other storage device. Some or all of the methods may alternatively be embodied in specialized hardware. Depending on the embodiment, the readable medium may be a hard disk drive, a compact disc, a digital video disc, or a tape drive.

Figure 1:
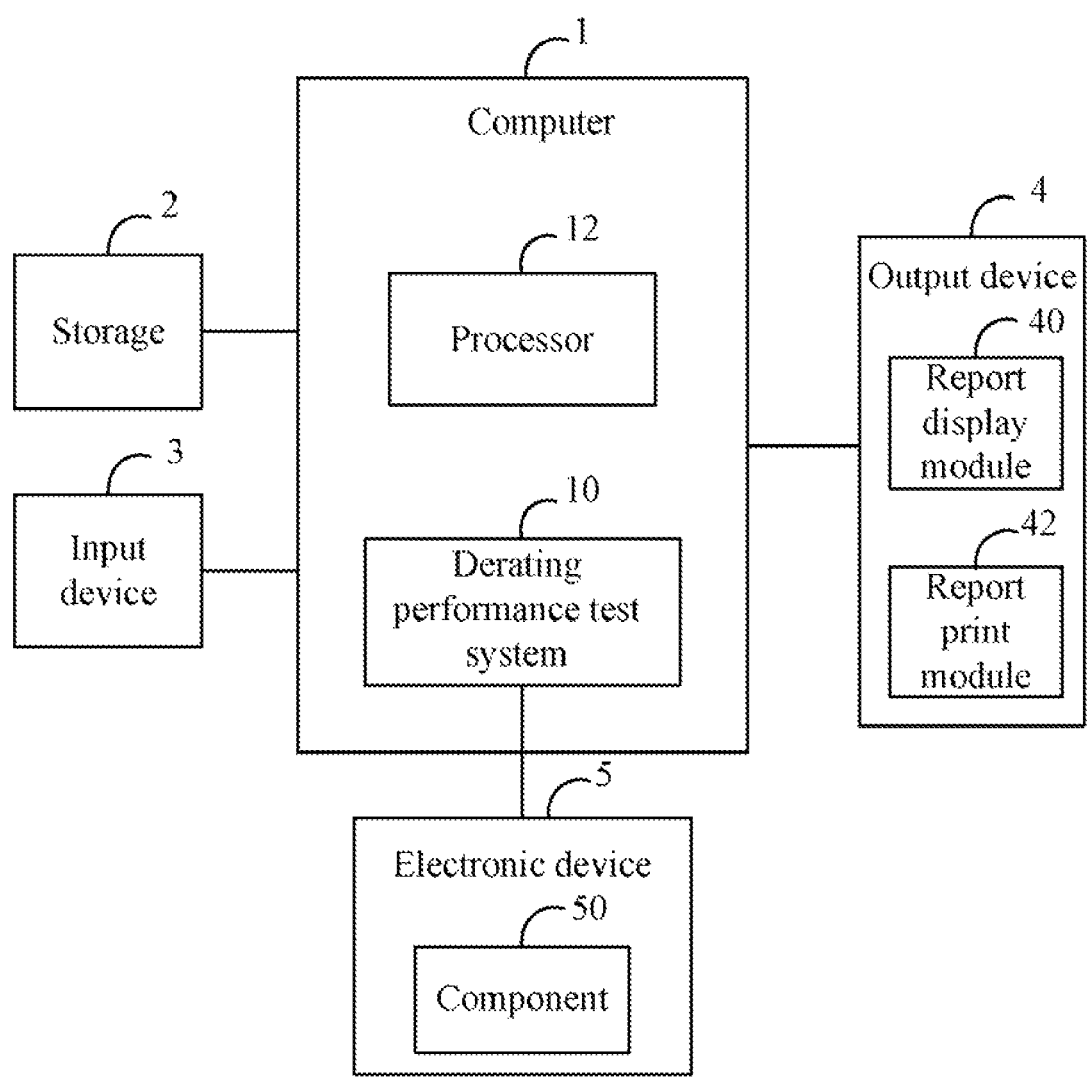
FIG. 1 is a block diagram of one embodiment of a computer including a derating test system for testing derating performance of a component of an electronic device.

FIG. 1 is a block diagram of one embodiment of a computer 1 including a derating performance test system 10. In one embodiment, the computer 1 is connected to a storage 2, an input device 3, and an output device 4. The storage 2 may be a hard disk drive, random access, memory, read only memory, a cache system or a combination of the aforementioned hardware. The storage 2 may store various kinds of data, such as a component list, a pin list, and a standard derating list, for example. The component list may include component information of each component 50 in the electronic device 5. The component 50 may be capacitors, resistors, or inductors, and the electronic device 5 may be a motherboard, for example. The input device 3 is used to input information of each component 50, such as parameters (e.g., resistance value, capacitance value) of each component 50. In one embodiment, the test system 10 may be used to test a derating ratio and a working temperature of each component in the component list according to the standard derating list for that component. In one embodiment, the output device 4 may include a report display module and a report print module. The report display module may display the report on a display of the output device 4 or on an external display. The report print module may print the report.

The computer 1 further includes a processor 12. The processor 12 executes one or more computerized operations of the computer 1 and other applications, to provide functions of the computer 1.

Figure 2:
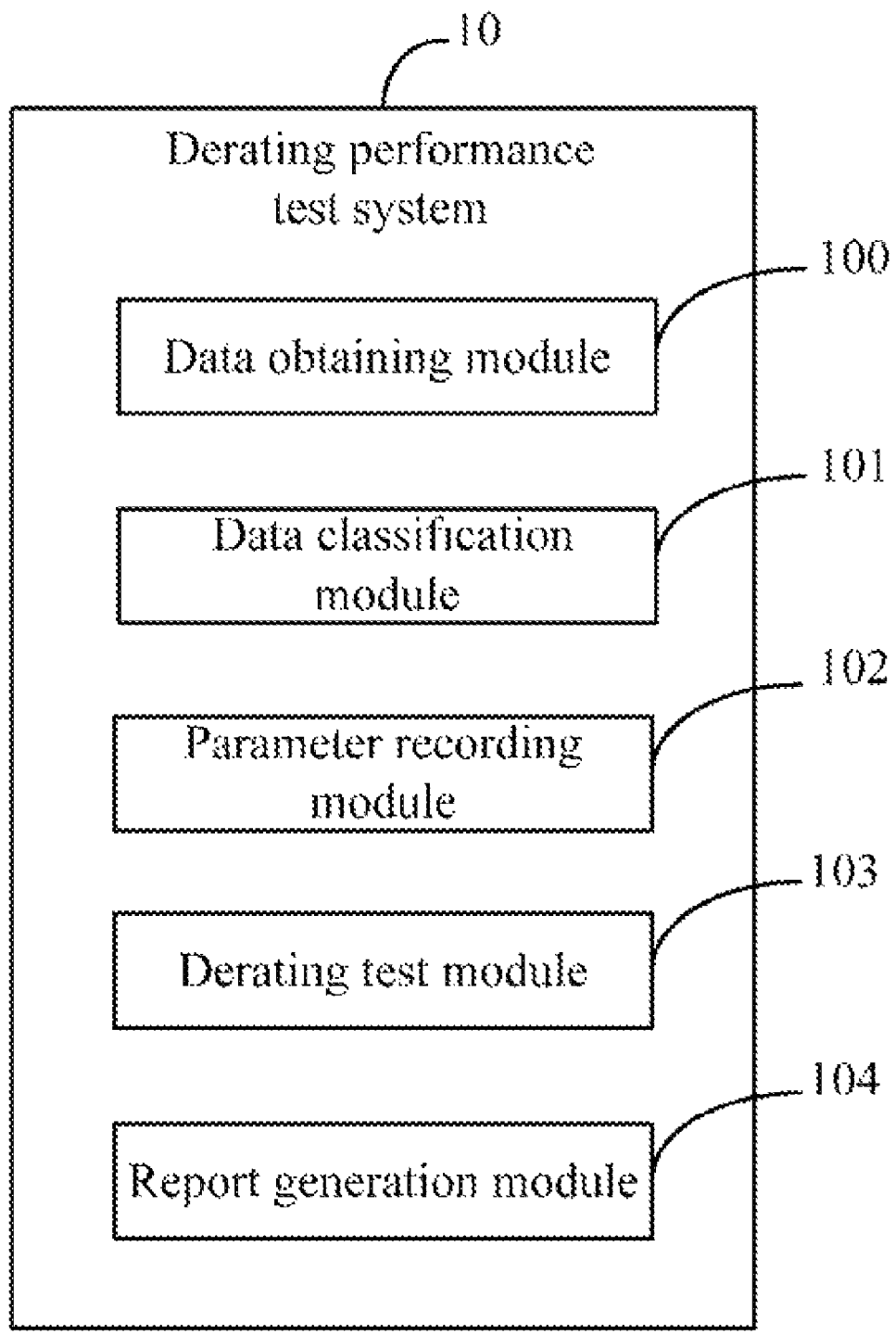
FIG. 2 is a block diagram of one embodiment of the derating performance test system in the FIG. 1.

FIG. 2 is a block diagram of one embodiment of the derating performance test system 10 in the FIG. 1. In one embodiment, the derating performance test system 10 includes a data obtaining module 100, a data classification module 101, a parameter recording module 102, a derating test module 103, and a report generation module 104. The modules 100, 101, 102, 103, and 104 may comprise one or more computerized codes to be executed by the processor 12 to perform one or more operations of the computer 1.

The data obtaining module 100 obtains a component list, a pin list, and a standard derating list from the storage 2. The component list may include component information of each component 50 in the electronic device 5, such as a name of each component 50 and a rated voltage of each component 50, for example. The pin list may include pin information of each component 50 in the electronic device 5, in one embodiment, each component 50 includes two pins. The standard derating list may include standard derating ratio range of each component 50 and standard working temperature range of each component 50. The component 50 may be capacitors, resistors, or inductors, for example.

The data classification module 101 classifies components 50 in the component list into different categories, such as capacitors, resistors, and inductors, for example.

The parameter recording module 102 receives parameters of each component 50 as measured by a user in each category. In one embodiment, the parameters of each component 50 include voltages of two pins of the component 50 and a working temperature of the component 50 at the voltages as measured by a user.

The derating test module 103 obtains component information of a component 50 to be tested from the component list. In one embodiment, the obtained component information of the component 50 may include a name of the component 50, a rated voltage of the component 50, and/or voltages of two pins of the component 50, and/or a working temperature of the component 50.

The derating test module 103 determines whether the obtained component information is valid. In one embodiment, if the obtained component information includes the voltages of two pins of the component 50 and a working temperature of the component 50, the derating test module 103 determines that the obtained component information is valid. If the obtained component information does not include the voltages of two pins of the component 50 and a working temperature of the component 50, the derating test module 103 determines that the obtained component information is invalid.

If the obtained component information is invalid, the derating test module 103 notifies the user that the component information is invalid. For example, the derating test module 103 may display a message on the output device 4.

If the obtained component information is valid, the derating test module 103 calculates a working voltage of the component 50 according to the voltages of two pins of the component 50. In one embodiment, the working voltage of the component 50 is an absolute value of a difference between the voltages of the two pins of the component 50. For example, if a component 50 includes a pin A and a pin B, a voltage of the pin A is 0 V, a voltage of the pin B is 3.3 V, then, the working voltage of the component=|3.3 V−0 V|=3.3 V.

The derating test module 103 calculates a derating ratio of the component 50 according to the calculated working voltage and a rated voltage of the component 50 in the component information. In one embodiment, the derating ratio of the component 50 is a ratio of the calculated working voltage and the rated voltage of the component 50. For example, if the calculated working voltage of the component 50 is 3.3 V, and the rated voltage of the component 50 is 33 V, then, the derating ratio of the component=3.3/33*100%=10%.

The derating test module 103 compares the derating ratio with a standard derating ratio range of the component 50 in the standard derating list to determine whether the derating ratio is valid. If the derating ratio is within the standard derating ratio range in the standard derating list, the derating test module 103 determines that the derating ratio is valid. If the derating ratio is not within the standard derating ratio range in the standard derating list, the derating test module 103 determines that the derating ratio is invalid.

The derating test module 103 compare the working temperature of the component 50 with a standard temperature range of the component 50 in the standard derating list to determine whether the working temperature is valid. If the working temperature is within the standard working temperature range in the standard derating list, the derating test module 103 determines the working temperature is valid. If the working temperature is not within the standard working temperature range in the standard derating list, the derating test module 103 determines that the working temperature is invalid.

The derating test module 103 determines whether any other component 50 of the component list needs to be tested.

The report generation module 104 generates a test report including the derating ratios, the comparison results of the derating ratio, the comparison results of the working temperature of all components of the component list, and store the test report in the storage 2.

Figure 3:
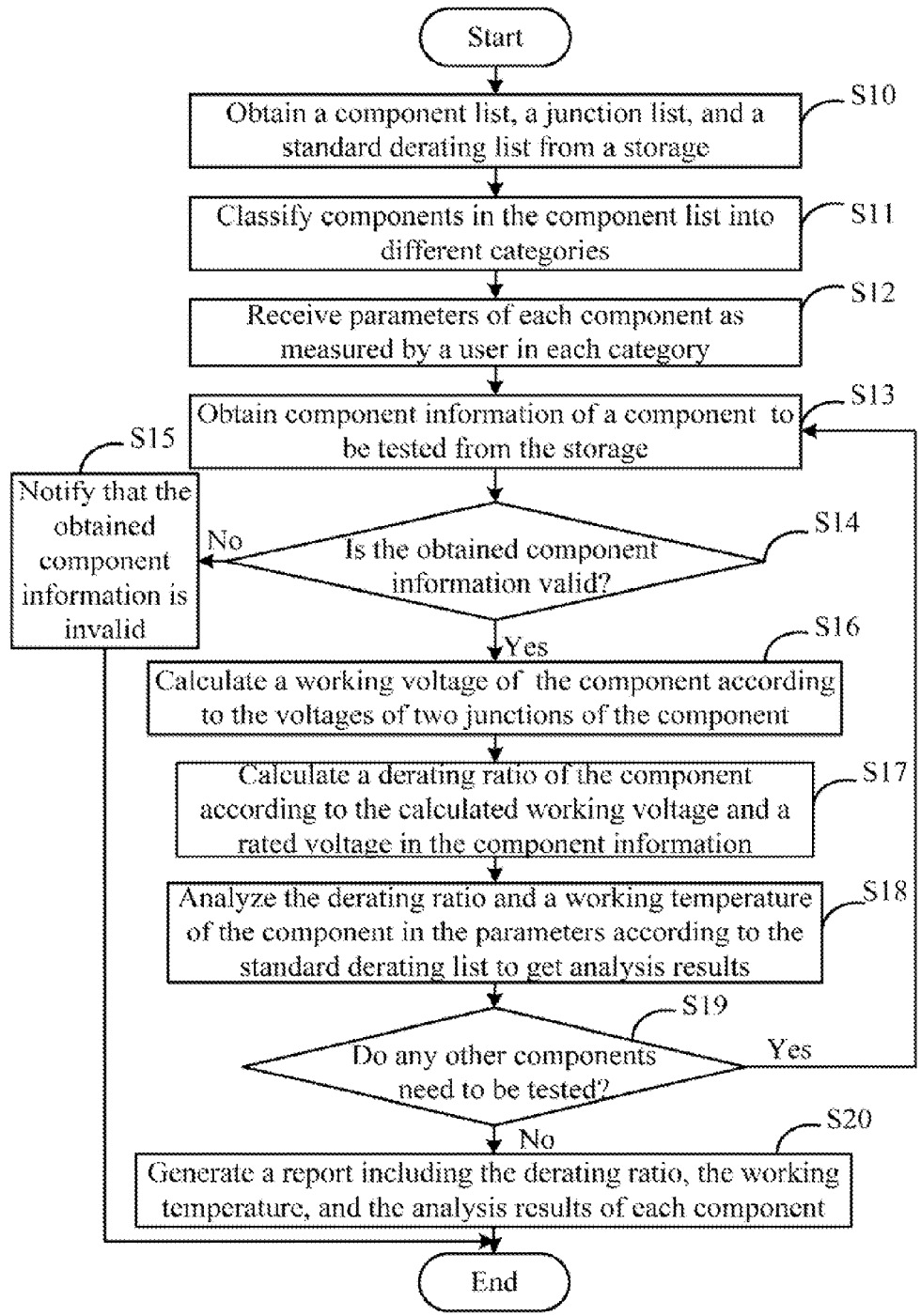
FIG. 3 is a flowchart of one embodiment of a method for testing derating performance of a component of an electronic device.

FIG. 3 is a flowchart of one embodiment of a method for testing derating performance of a component of an electronic device. Depending on the embodiment, additional blocks may be added, others removed, and the ordering of the blocks may be changed.

In block S10, the data obtaining module 100 obtains a component list, a pin list, and a standard derating list from the storage 2.

In block S11, the data classification module 101 classifies components in the component list into different categories, such as capacitors, resistors, and inductors, for example.

In block S12, the parameter recording module 102 receives parameters of each component 50 as measured by a user in each category. The parameters of each component 50 include voltages of two pins of the component 50 and a working temperature of the component 50.

In block S13, the derating test module 103 obtains component information of a component 50 to be tested from the component list. The obtained component information of the component 50 may include a name of each component 50, a rated voltage of the component 50, and/or parameters of the component 50.

In block S14, the derating test module 103 determines whether the obtained component information is valid, that is, checks that parameter recording module 102 has received the parameters. If the obtained component information includes the voltages of two pins of the component 50 and a working temperature of the component 50, the derating test module 103 determines that the obtained component information is valid. If the obtained component information does not include the voltages of two pins of the component 50 and a working temperature of the component 50, the derating test module 103 determines that the obtained component information is invalid.

In block S15, if the obtained component information is invalid, the derating test module 103 notifies the user that the component information is invalid.

In block S16, if the obtained component information is valid, the derating test module 103 calculates a working voltage of the component 50 according to the voltages of two pins of the component 50. The working voltage of the component 50 is an absolute value of a difference between the voltages of the two pins of the component 50.

In block S17, the derating test module 103 calculates a derating ratio of the component 50 according to the calculated working voltage and a rated voltage of the component 50 in the component information. The derating ratio of the component 50 is a ratio of the working voltage and the rated voltage of the component 50.

In block S18, the derating test module 103 compares the derating ratio with a standard derating ratio range of the component 50 in the standard derating list to determine whether the derating ratio is valid, and compares the working temperature of the component 50 with a standard temperature range of the component 50 in the standard derating list to determine whether the working temperature is valid. If the derating ratio is within the standard derating ratio range in the standard derating list, the derating test module 103 determines that the derating ratio is valid. If the derating ratio is not within the standard derating ratio range in the standard derating list, the derating test module 103 determines that the derating ratio is invalid. If the working temperature is within the standard working temperature range in the standard derating list, the derating test module 103 determines that the working temperature is valid. If the working temperature is not within the standard working temperature range in the standard derating list, the derating test module 103 determines that the working temperature is invalid.

In block S19, the derating test module 103 determines whether any other component of the component list needs to be tested.

In block S20, if there are no more components 50 that need to be tested, the report generation module 104 generates a test report including the derating ratios, the comparison results of the derating ratio, the comparison results of the working temperature of all components of the component list, and stores the test report in the storage 2. Otherwise, if there are components of the component list that need to be tested, the procedure returns to block S13 described above.

It should be emphasized that the above-described embodiments of the present disclosure, particularly, any embodiments, are merely possible examples of implementations, merely set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this disclosure and the present disclosure and protected by the following claims.

What is claimed is:

1. A computer system for testing derating performance of a component of an electronic device, the computer system comprising:
   a storage operable to store component information of the component;
   at least one processor; and
   one or more programs stored in the storage and being executable by the at least one processor, the one or more programs comprising:
   a data obtaining module operable to obtain a component list, a pin list, and a standard derating list of the electronic device from the storage;

a data classification module operable to classify components in the component list into different categories;

a parameter recording module operable to receive parameters of each component as measured by a user in each category, the parameters of each component comprising voltages of two pins of the component and a working temperature of the component;

a derating test module operable to obtain component information of a component from the storage, calculate a working voltage of the component according to the voltages of two pins of the component, calculate a derating ratio of the component according to the calculated working voltage and a rated voltage of the component in the component information, compare the derating ratio with a standard derating ratio range of the component in the standard derating list to get a first analysis result of the derating ratio, compare the working temperature of the component with a standard temperature range of the component in the standard derating list to get a second analysis result of the working temperature; and a report generation module operable to generate a test report comprising the derating ratio, the working temperature, the first and second analysis results of each component in the component list, and store the test report in the storage.

2. The computer system according to claim 1, wherein the working voltage of the component is an absolute value of a difference between the voltages of the two pins of the component.

3. The computer system according to claim 1, wherein the derating ratio of the component is a ratio of the calculated working voltage of the component and the rated voltage of the component.

4. The computer system according to claim 1, wherein the derating test module determines that the derating ratio is valid if the derating ratio is within the standard derating ratio range in the standard derating list, or determines that the derating ratio is invalid if the derating ratio is not within the standard derating ratio range in the standard derating list.

5. The computer system according to claim 1, wherein the derating test module determines that the working temperature is valid if the working temperature is within the standard working temperature range in the standard derating list, or determines that the working temperature is invalid if the working temperature is not within the standard working temperature range in the standard derating list.

6. A computer-implemented method being executed by a processor of a computer for testing derating performance of a component of an electronic device, the method comprising:

obtaining a component list, a pin list, and a standard derating list of the electronic device from a storage;

classifying components in the component list into different categories;

receiving parameters of each component as measured by a user in each category, the parameters of each component comprising voltages of two pins of the component and a working temperature of the component;

obtaining component information of a component from the storage;

calculating a working voltage of the component according to the voltages of two pins of the component;

calculating a derating ratio of the component on the processor according to the calculated working voltage and a rated voltage of the component in the component information;

comparing the derating ratio with a standard derating ratio range of the component in the standard derating list to get a first analysis result of the derating ratio;

comparing the working temperature of the component with a standard temperature range of the component in the standard derating list to get a second analysis result of the working temperature; and generating a test report comprising the derating ratio, the working temperature, the first and second analysis results of each component in the component list, and storing the test report in the storage.

7. The method according to claim 6, wherein the working voltage of the component is an absolute value of a difference between the voltages of the two pins of the component.

8. The method according to claim 6, wherein the derating ratio of the component is a ratio of the calculated working voltage of the component and the rated voltage of the component.

9. The method according to claim 6, wherein the derating ratio is valid if the derating ratio is within the standard derating ratio range in the standard derating list, or the derating ratio is invalid if the derating ratio is not within the standard derating ratio range in the standard derating list.

10. The method according to claim 6, wherein the working temperature is valid if the working temperature is within the standard working temperature range in the standard derating list, or the working temperature is invalid if the working temperature is not within the standard working temperature range in the standard derating list.

11. A non-transitory computer readable medium containing computer instructions stored therein for causing a computer processor to perform a method for testing derating performance of a component of an electronic device, the method comprising:

obtaining a component list, a pin list, and a standard derating list of the electronic device from a storage;

classifying components in the component list into different categories;

receiving parameters of each component as measured by a user in each category, the parameters of each component comprising voltages of two pins of the component and a working temperature of the component;

obtaining component information of a component from the storage;

calculating a working voltage of the component according to the voltages of two pins of the component;

calculating a derating ratio of the component according to the calculated working voltage and a rated voltage of the component in the component information;

comparing the derating ratio with a standard derating ratio range of the component in the standard derating list to get a first analysis result of the derating ratio;

comparing the working temperature of the component with a standard temperature range of the component in the standard derating list to get a second analysis result of the working temperature; and generating a test report comprising the derating ratio, the working temperature, the first and second analysis results of each component in the component list, and storing the test report in the storage.

12. The non-transitory computer readable medium according to claim 11, wherein the working voltage of the component is an absolute value of a difference between the voltages of the two pins of the component.

13. The non-transitory computer readable medium according to claim 11, wherein the derating ratio of the component is a ratio of the calculated working voltage of the component and the rated voltage of the component.

14. The non-transitory computer readable medium according to claim 11, wherein the derating ratio is valid if the derating ratio is within the standard derating ratio range in the standard derating list, or the derating ratio is invalid if the derating ratio is not within the standard derating ratio range in the standard derating list.

15. The non-transitory computer readable medium according to claim 11, wherein the working temperature is valid if the working temperature is within the standard working temperature range in the standard derating list, or the working temperature is invalid if the working temperature is not within the standard working temperature range in the standard derating list.

* * * * *